United States Patent
Chang et al.

(10) Patent No.: US 12,495,569 B2
(45) Date of Patent: Dec. 9, 2025

(54) HIGH ELECTRON MOBILITY TRANSISTOR

(71) Applicants: National Yang Ming Chiao Tung University, Hsinchu (TW); National Chung-Shan Institute of Science and Technology, Taoyuan (TW)

(72) Inventors: Edward Yi Chang, Baoshan Township (TW); You-Chen Weng, New Taipei (TW); Min-Lu Kao, Chiayi (TW)

(73) Assignees: NATIONAL YANG MING CHIAO TUNG UNIVERSITY, Hsinchu (TW); NATIONAL CHUNG-SHAN INSTITUTE OF SCIENCE AND TECHNOLOGY, Taoyuan (TW)

( * ) Notice: Subject to any disclaimer, the term of this patent is extended or adjusted under 35 U.S.C. 154(b) by 426 days.

(21) Appl. No.: 18/096,916

(22) Filed: Jan. 13, 2023

(65) Prior Publication Data

US 2024/0136432 A1 Apr. 25, 2024
US 2024/0234561 A9 Jul. 11, 2024

(30) Foreign Application Priority Data

Oct. 20, 2022 (TW) ................................. 111139820

(51) Int. Cl.
*H01L 29/778* (2006.01)
*H01L 29/15* (2006.01)
(Continued)

(52) U.S. Cl.
CPC ......... *H10D 30/475* (2025.01); *H10D 62/815* (2025.01); *H10D 62/8503* (2025.01)

(58) Field of Classification Search
CPC ........... G02F 1/13336; G02F 1/133308; G02F 1/1337; H10D 30/475; H10D 62/815;
(Continued)

(56) References Cited

U.S. PATENT DOCUMENTS

2008/0204140 A1* 8/2008 Kikkawa .............. H10D 30/015
257/191
2014/0091314 A1* 4/2014 Ishiguro ............. H10D 62/8164
257/76
(Continued)

FOREIGN PATENT DOCUMENTS

CN 209199932 U 8/2019
TW 201628191 A 8/2016

OTHER PUBLICATIONS

Cho et al., "Enhancement of channel conductivity in AlGaN/GaN heterostructure field effect transistors by AlGaN:Si back barrier," Appl. Phys. Lett., vol. 99, 2011, pp. 103505-1-103505-3, (total 4 pages).
(Continued)

*Primary Examiner* — Tracie Y Green
(74) *Attorney, Agent, or Firm* — Birch, Stewart, Kolasch & Birch, LLP

(57) ABSTRACT

A high electron mobility transistor includes a growth substrate, a lattice matching layer, an back-barrier layer, an electron blocking layer, a channel layer, an active layer, a source, a gate, and a drain. The lattice matching layer and the back-barrier layer are formed on the growth substrate. The back-barrier layer includes GaN doped with C. The electron blocking layer is formed on the back-barrier layer. The electron blocking layer includes AlGaN, wherein the doping percent of Al atoms of the AlGaN is 3~5% and the doping percent of Ga atoms of the AlGaN is 95~97%. The electron blocking layer has a thickness of 2~5 nm. The channel layer and the active layer are formed on the electron blocking layer. The source, the gate, and the drain are formed on the active layer.

10 Claims, 3 Drawing Sheets

(51) Int. Cl.
  *H01L 29/20* (2006.01)
  *H10D 30/47* (2025.01)
  *H10D 62/815* (2025.01)
  *H10D 62/85* (2025.01)

(58) Field of Classification Search
  CPC .......... H10D 62/8503; H10D 30/4732; H10D 30/015; H10D 62/854
  See application file for complete search history.

(56) References Cited

U.S. PATENT DOCUMENTS

| | | | |
|---|---|---|---|
| 2016/0211330 A1* | 7/2016 | Li | H10D 30/475 |
| 2023/0170409 A1* | 6/2023 | Yamada | H10D 62/402 |
| | | | 257/183 |

OTHER PUBLICATIONS

Hilt et al., "Impact of Buffer Composition on the Dynamic On-State Resistance of High-Voltage AlGaN/GaN HFETs," Proceedings of the 2012 24th International Symposium on Power Semiconductor Devices and ICs, Bruges, Belgium, Jun. 3-7, 2012, pp. 345-348, (total 4 pages).

Klein et al., "Current collapse and the role of carbon in AlGaN/GaN high electron mobility transistors grown by metalorganic vapor-phase epitaxy," Appl. Phys. Lett., vol. 79, No. 21, 2001, pp. 3527-3529, (total 4 pages).

Kaun et al., "Reduction of carbon proximity effects by including AlGaN back barriers in HEMTs on free-standing GaN," Electronics Letters, vol. 49, No. 14, 2013, total 2 pages.

Lee et al., "High Figure-of-Merit ($V^2_{BR}/R_{ON}$) AlGaN/GaN Power HEMT With Periodically C-Doped GaN Buffer and AlGaN Back Barrier," IEEE Journal of the Electron Devices Society, vol. 6, 2018, pp. 1179-1186, (total 8 pages).

Lopatiuk et al., "Electron trapping effects in C- and Fe-doped GaN and AlGaN," Solid-State Electronics, vol. 49, 2005, pp. 1662-1668, (total 7 pages).

Meneghesso et al., "GaN-based power HEMTs: Parasitic, Reliability and high field issues," ECS Transactions, vol. 58, No. 4, 2013, pp. 187-198, (total 13 pages).

Poblenz et al., "Effect of carbon doping on buffer leakage in AlGaN/GaN high electron mobility transistors," Journal of Vacuum Science & Technology B: Microelectronics and Nanometer Structures Processing, Measurement, and Phenomena, vol. 22, 2004, pp. 1145-1149, (total 6 pages).

Webb et al., "Semi-insulating C-doped GaN and high-mobility AlGaN/GaN heterostructures grown by ammonia molecular beam epitaxy," Appl. Phys. Lett., vol. 75, No. 7, 1999, pp. 953-955, (total 4 pages).

Weng et al., "A Novel GaN:C Millimeter-Wave HEMT with AlGaN Electron-Blocking Layer," Materials, vol. 15, No. 703, 2022, pp. 1-10. A Declaration (total of 3 pages) corresponding to this reference is also attached.

Yang et al., "High Channel Conductivity, Breakdown Field Strength, and Low Current Collapse in AlGaN/GaN/Si δ-Doped AlGaN/GaN:C HEMTs," IEEE Transactions on Electron Devices, vol. 66, No. 3, 2019, pp. 1202-1207, (total 6 pages).

* cited by examiner

HIGH ELECTRON MOBILITY TRANSISTOR

This application claims priority of Application No. 111139820 filed in Taiwan on 20 Oct. 2022 under 35 U.S.C. § 119; the entire contents of all of which are hereby incorporated by reference.

BACKGROUND OF THE INVENTION

Field of the Invention

The present invention relates to a transistor, particularly to a high electron mobility transistor.

Description of the Related Art

In the epitaxial technology, the main advantages of the back-barrier layer made of GaN doped with C (GaN:C) include an increased breakdown voltage and a low cost (no additional reactant elements are required). GaN:C is a P-type. Defects will be formed between the energy bands, and the energy level will increase with the doping percent (because the Fermi level moves down), so as to form a barrier layer and increase the overall breakdown voltage of the device. However, due to the increase of the defect density, the GaN:C barrier layer will trap current during the operation of the device, which will increase the dynamic resistance of the device. The effect of trapping electrons of the device will increase with the increase of operating frequency and voltage. As a result, general high-frequency components do not include back-barrier layers made of GaN:C.

Most of the current GaN epitaxial structures are doped with carbon atoms to increase the voltage withstand characteristics of the device, thereby meeting the requirements of applications of high-power components. For example, high-power components require 200, 600 or 1200 volts. However, with the development of the application of GaN-based components, the demand for high-frequency applications of AlGaN/GaN high electron mobility transistors has gradually increased. Most of present products form GaN layers on SiC substrates, wherein buffer layers are doped with Fe. Thus, the price has remained high. This is because the SiC substrate is expensive and the SiC substrate needs the epitaxial process. In addition, iron ions have a diffusion length of about 1 micrometer, which is not suitable for fabricating components.

To overcome the abovementioned problems, the present invention provides a high electron mobility transistor, so as to solve the afore-mentioned problems of the prior art.

SUMMARY OF THE INVENTION

The present invention provides a high electron mobility transistor, which prevents a back-barrier layer from trapping a horizontal current and improves the characteristics of a two-dimensional electron gas.

In an embodiment of the present invention, a high electron mobility transistor includes a growth substrate, a lattice matching layer, a back-barrier layer, an electron blocking layer, a channel layer, an active layer, a source, a gate, and a drain. The lattice matching layer is formed on the growth substrate. The back-barrier layer, formed on the lattice matching layer, includes GaN doped with C, an AlN and GaN supperlattice doped with C, or an AlN and AlGaN superlattice doped with C. The electron blocking layer is formed on the back-barrier layer. The electron blocking layer includes AlGaN. The Al atoms of the AlGaN have a doping percent of 3~5%, the Ga atoms of the AlGaN have a doping percent of 95~97%, and the electron blocking layer has a thickness of 2~5 nm. The channel layer is formed on the electron blocking layer. The active layer is formed on the channel layer. The source, the gate, and the drain are formed on the active layer, wherein the gate is located between the source and the drain.

In an embodiment of the present invention, the growth substrate comprises Si, GaN, SiC, or sapphire.

In an embodiment of the present invention, the lattice matching layer comprises AlGaN or ATN.

In an embodiment of the present invention, the channel layer comprises GaN.

In an embodiment of the present invention, the active layer comprises AlGaN.

In an embodiment of the present invention, the high electron mobility transistor further includes a protection layer formed on the active layer. The source, the gate, and the drain are formed on the protection layer.

In an embodiment of the present invention, the protection layer comprises GaN.

In an embodiment of the present invention, the high electron mobility transistor further includes an insulation layer formed on the protection layer. The insulation layer covers the side walls of the source, the gate, and the drain.

In an embodiment of the present invention, the high electron mobility transistor further includes a superlattice layer formed between the lattice matching layer and the back-barrier layer.

In an embodiment of the present invention, the superlattice layer includes AlN or GaN, wherein the GaN is replaced with AlGaN.

To sum up, the high electron mobility transistor includes the back-barrier layer made of GaN doped with C and employs the electron blocking layer to prevent the back-barrier layer from trapping a horizontal current and improve the characteristics of a two-dimensional electron gas.

Below, the embodiments are described in detail in cooperation with the drawings to make easily understood the technical contents, characteristics and accomplishments of the present invention.

DETAILED DESCRIPTION OF THE INVENTION

Figure 1:
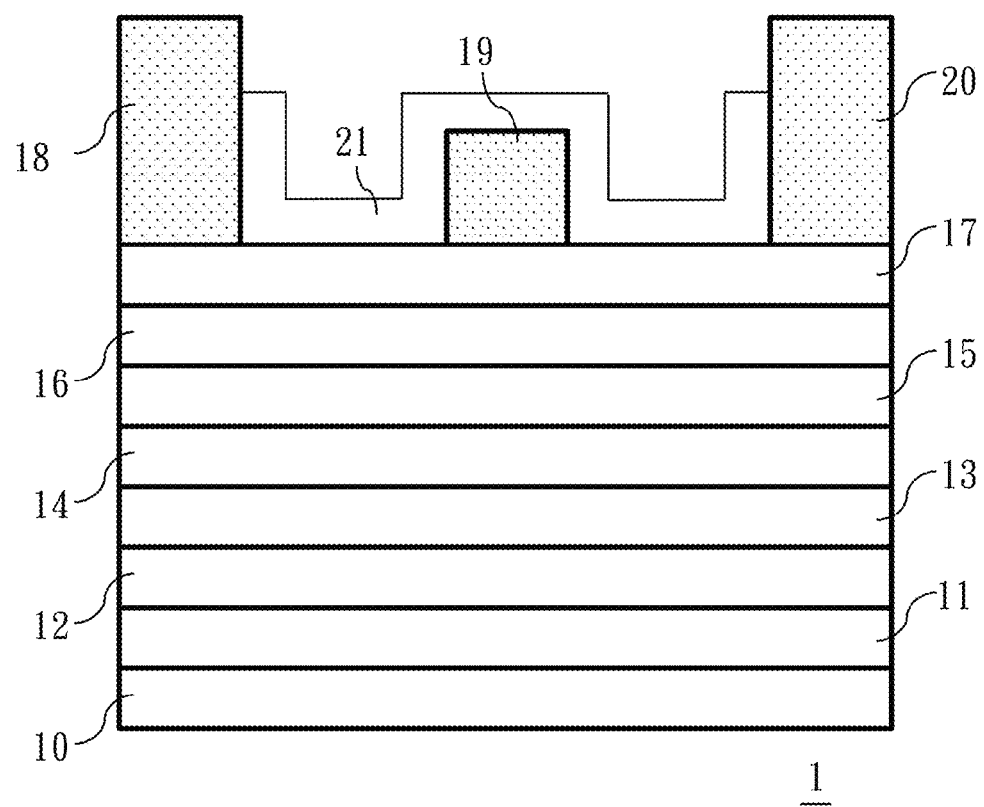
FIG. 1 is a cross-sectional view of a high electron mobility transistor according to an embodiment of the present invention.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Certain terms are used throughout the description and the claims to refer to particular components. One skilled in the art appreciates that a component may be referred to using different names. This disclosure does not intend to distinguish between components that differ in name but not in function. In the description and in the claims, the term "comprise" is used in an open-ended fashion, and thus should be interpreted to mean "include, but not limited to." The phrases "be coupled to," "couples to," and "coupling to" are intended to encompass any indirect or direct connection. Accordingly, if this disclosure mentions that a first device is coupled with a second device, it means that the first device may be directly or indirectly connected to the second device through electrical connections, wireless communications, optical communications, or other signal connections with/without other intermediate devices or connection means.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment.

Unless otherwise specified, some conditional sentences or words, such as "can", "could", "might", or "may", usually attempt to express what the embodiment in the present invention has, but it can also be interpreted as a feature, element, or step that may not be needed. In other embodiments, these features, elements, or steps may not be required.

In the following description, a high electron mobility transistor will be described, which includes a back-barrier layer made of GaN doped with C and employs an electron blocking layer to prevent the back-barrier layer from trapping a horizontal current and improve the characteristics of a two-dimensional electron gas.

FIG. 1 is a cross-sectional view of a high electron mobility transistor according to an embodiment of the present invention. Referring to FIG. 1, a high electron mobility transistor 1 includes a growth substrate 10, a lattice matching layer 11, a superlattice layer 12, a back-barrier layer 13, an electron blocking layer 14, a channel layer 15, an active layer 16, a protection layer 17, a source 18, a gate 19, a drain 20, and an insulation layer 21. The growth substrate 10 may include Si, GaN, SiC, or sapphire. The lattice matching layer 11 may include AlGaN or AlN. When the lattice matching layer 11 is made of AlGaN, the Al atoms of the AlGaN have a doping percent of 40% and the Ga atoms of the AlGaN have a doping percent of 60%. The lattice matching layer 11 may have a thickness of 170 nm. The superlattice layer 12 may include AlN or GaN, wherein the GaN is replaced with AlGaN. The lattice matching layer 11 may have a thickness of 0.8 lam. The present invention is not limited to the order of stacking the AlN layer and the GaN layer of the superlattice layer 12. The back-barrier layer 13 includes GaN doped with C, an AlN and GaN supperlattice doped with C, or an AlN and AlGaN superlattice doped with C. The back-barrier layer 13 may have a thickness of 0.5 lam. Since C atoms do not drift, they are suitable for fabricating the high electron mobility transistor 1. The electron blocking layer 14 includes AlGaN, wherein the Al atoms of the AlGaN have a doping percent of 3~5%, the Ga atoms of the AlGaN have a doping percent of 95~97%, and the electron blocking layer 14 has a thickness of 2~5 nm. The channel layer 15 may include GaN and have a thickness of 0.5 μm. The active layer 16 may include AlGaN, wherein the Al atoms of the AlGaN have a doping percent of 24%, and the Ga atoms of the AlGaN have a doping percent of 76%. The active layer 16 may have a thickness of 22 nm. The protection layer 17 may include GaN and have a thickness of 1 nm.

The lattice matching layer 11 is formed on the growth substrate 10. The superlattice layer 12 is formed on the lattice matching layer 11. The back-barrier layer 13 is formed on the superlattice layer 12. The superlattice layer 12 is formed between the lattice matching layer 11 and the back-barrier layer 13. The electron blocking layer 14 is formed on the back-barrier layer 13. The channel layer 15 is formed on the electron blocking layer 14. The active layer 16 is formed on the channel layer 15. The protection layer 17 is formed on the active layer 16. The source 18, the gate 19, and the drain 20 are formed on the protection layer 17. The gate 19 is located between the source 18 and the drain 20. The insulation layer 21, formed on the protection layer 17, covers the side walls of the source 18, the gate 19, and the drain 20.

When the high electron mobility transistor 1 is turned on, a vertical current is generated to cause a leakage current. When the high electron mobility transistor 1 operates, a horizontal current between the source 18 and the drain 20 is caused by a two-dimensional electron gas between the active layer 16 and the channel layer 15. The back-barrier layer 13 doped with C has a high energy band. Since the energy band of the electron blocking 14 is less than the energy band of the back-barrier 13 and greater than the energy band of the channel layer 15, the two-dimensional electron gas is formed between the electron blocking layer 14 and the channel layer 15 and the horizontal current is locked in the channel layer 15 to prevent the back-barrier layer 13 from trapping the horizontal current and improve the characteristics of the two-dimensional electron gas. However, the electron blocking layer 14 can allow the vertical current to pass. The back-barrier layer 13 and the superlattice layer 12 can block the vertical current to decrease the leakage current. The thickness and the doping percent of the Al atoms of the electron blocking layer 14 are limited. When the thickness of the electron blocking layer 14 is thicker or the doping percent of the Al atoms of the electron blocking layer 14 is higher, the two-dimensional electron gas is formed between the electron blocking layer 14 and the back-barrier layer 13 such that the high electron mobility transistor cannot be pinched off. When the thickness of the electron blocking layer 14 is thinner or the doping percent of the Al atoms of the electron blocking layer 14 is lower, the two-dimensional electron gas cannot be locked in the channel layer 15. The back-barrier layer 13 can trap the horizontal current and degrade the characteristics of the two-dimensional electron gas.

Figure 2:
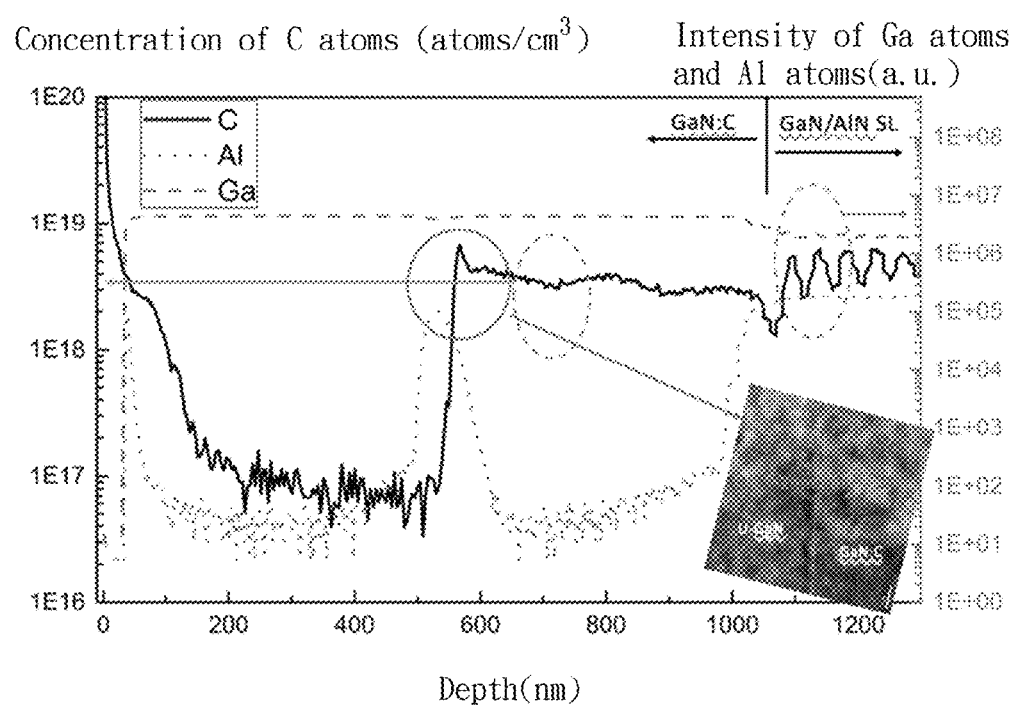
FIG. 2 is a diagram illustrating curves of the depth, the concentration of C atoms, the intensity of Al atoms, and the intensity of Ga atoms of a high electron mobility transistor according to an embodiment of the present invention.
Figure 3:
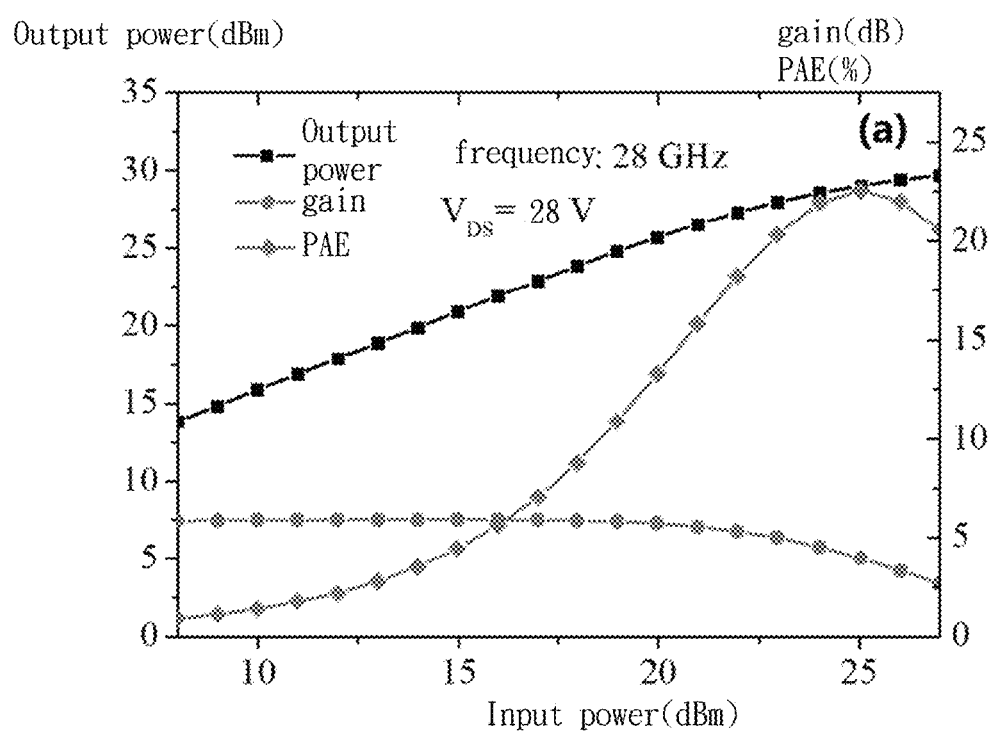
FIG. 3 is a diagram illustrating curves of the input power, the output power, the gain, and the power added efficiency (PAE) of a high electron mobility transistor according to an embodiment of the present invention.

FIG. 2 is a diagram illustrating curves of the depth, the concentration of C atoms, the intensity of Al atoms, and the intensity of Ga atoms of a high electron mobility transistor according to an embodiment of the present invention. FIG. 3 is a diagram illustrating curves of the input power, the output power, the gain, and the power added efficiency (PAE) of a high electron mobility transistor according to an embodiment of the present invention. As illustrated in FIG. 2, the concentration of C atoms suddenly increases in depth of about 550 nm. The bottom right inset in FIG. 2 is a transmission electron microscope (TEM) image, which shows an interface between unintentionally-doped GaN and GaN doped with C. As illustrated in FIG. 3, the frequency of the input signal is 28 GHz and the drain-source voltage $V_{DS}$ is 28 V. As illustrated in FIG. 3, the high electron mobility transistor of the present invention measures the amplification characteristics in the ka band, and a single high electron mobility transistor can achieve output power of about 1 W.

Refer to FIG. 1. In another embodiment, the insulation layer 21 can be omitted. In further embodiment, the protection layer 17 can be omitted such that the source 18, the gate 19, and the drain 20 are directly formed on the active layer 16. In some embodiments, the superlattice layer 12 can be omitted such that the back-barrier layer 13 is directly formed on the lattice matching layer 11.

According to the embodiments provided above, the high electron mobility transistor includes the back-barrier layer made of GaN doped with C, an MN and GaN superlattice doped with C, or an MN and AlGaN superlattice doped with C and employs the electron blocking layer to prevent the back-barrier layer from trapping a horizontal current and improve the characteristics of a two-dimensional electron gas.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A high electron mobility transistor comprising:
   a growth substrate;
   a lattice matching layer formed on the growth substrate;
   a back-barrier layer formed on the lattice matching layer, wherein the back-barrier layer comprises GaN doped with C, an AlN and GaN superlattice doped with C, or an AlN and AlGaN superlattice doped with C;
   an electron blocking layer formed on the back-barrier layer, wherein the electron blocking layer comprises AlGaN, Al atoms of the AlGaN have a doping percent of 3~5%, Ga atoms of the AlGaN have a doping percent of 95~97%, and the electron blocking layer has a thickness of 2~5 nm;
   a channel layer formed on the electron blocking layer;
   an active layer formed on the channel layer; and
   a source, a gate, and a drain formed on the active layer, wherein the gate is located between the source and the drain.

2. The high electron mobility transistor according to claim 1, wherein the growth substrate comprises Si, GaN, SiC, or sapphire.

3. The high electron mobility transistor according to claim 1, wherein the lattice matching layer comprises AlGaN or AlN.

4. The high electron mobility transistor according to claim 1, wherein the channel layer comprises GaN.

5. The high electron mobility transistor according to claim 1, wherein the active layer comprises AlGaN.

6. The high electron mobility transistor according to claim 1, further comprising a protection layer formed on the active layer, wherein the source, the gate, and the drain are formed on the protection layer.

7. The high electron mobility transistor according to claim 6, wherein the protection layer comprises GaN.

8. The high electron mobility transistor according to claim 6, further comprising an insulation layer formed on the protection layer, wherein the insulation layer covers side walls of the source, the gate, and the drain.

9. The high electron mobility transistor according to claim 1, further comprising a superlattice layer formed between the lattice matching layer and the back-barrier layer.

10. The high electron mobility transistor according to claim 1, wherein the superlattice layer comprises AlN or GaN.

* * * * *